Figure 1:
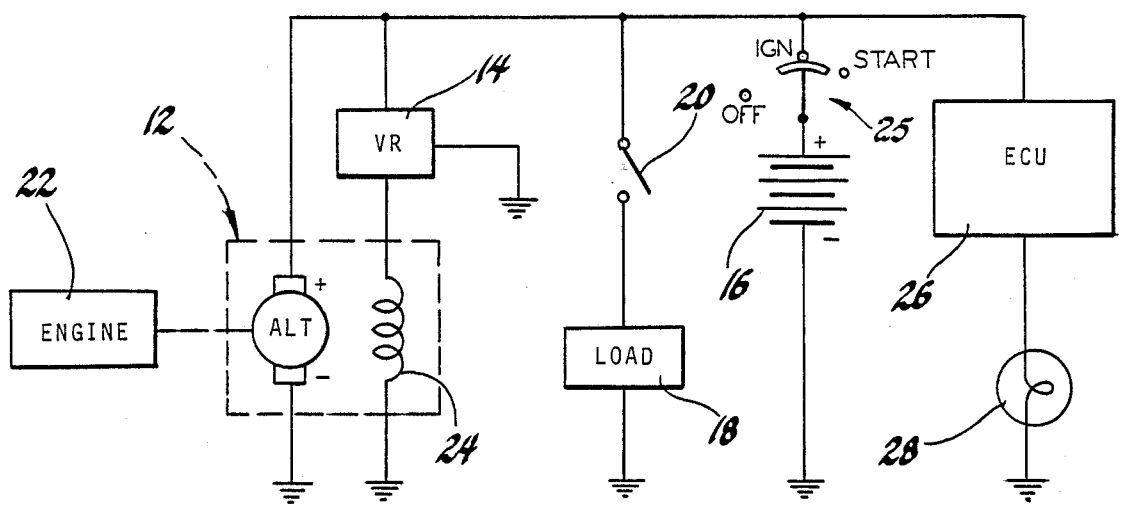

United States Patent [19]

Nowakowski et al.

[11] Patent Number: 4,803,417

[45] Date of Patent: Feb. 7, 1989

[54] VEHICLE BATTERY DISCHARGING INDICATOR

[75] Inventors: Robert J. Nowakowski, Indianapolis; Van V. Riesberg, Jr., Anderson, both of Ind.

[73] Assignee: General Motors Corporation, Detroit, Mich.

[21] Appl. No.: 944,753

[22] Filed: Dec. 22, 1986

[51] Int. Cl.[4] .............................................. H02J 7/16
[52] U.S. Cl. ........................................ 320/48; 320/37; 320/39
[58] Field of Search ............................ 320/37, 39, 48; 340/636; 324/424, 433; 364/481, 483, 424

[56] References Cited

U.S. PATENT DOCUMENTS

| | | | |
|---|---|---|---|
| 4,180,770 | 12/1979 | Eby | 320/48 |
| 4,229,688 | 10/1980 | Knox et al. | 320/48 |
| 4,290,109 | 9/1981 | Taniguchi et al. | 320/32 |
| 4,320,334 | 3/1982 | Davis et al. | 320/48 |
| 4,423,378 | 12/1983 | Marino et al. | 320/48 |
| 4,424,477 | 1/1984 | Enoshima et al. | 320/61 |
| 4,451,774 | 5/1984 | Akita et al. | 320/48 |
| 4,527,112 | 7/1985 | Herman | 320/61 |
| 4,665,370 | 5/1987 | Holland | 346/636 |

Primary Examiner—Patrick R. Salce
Assistant Examiner—Anita M. Ault
Attorney, Agent, or Firm—David L. Ahlersmeyer

[57] ABSTRACT

An apparatus for and method of indicating when the battery in a motor vehicle is discharging is disclosed in which the battery voltage during vehicle operation is monitored and compared to a stored value representing the open-circuit voltage of the battery measured prior to the vehicle engine being cranked for starting. An indication that the battery is discharging is provided only after a discharging condition, i.e., the battery voltage is less than the stored value, is detected at each of a predetermined member of consecutive timed intervals.

6 Claims, 2 Drawing Sheets

VEHICLE BATTERY DISCHARGING INDICATOR

This invention relates to a motor vehicle electrical system wherein the voltage of a storage battery is monitored during vehicle operation and compared to a stored voltage value representing the voltage of the battery measured prior to starting the vehicle to indicate whether the battery is discharging.

More particularly, the present invention is applicable to a vehicle charging system in which an engine drives an alternator to provide direct current to the vehicle battery and vehicle electrical loads at a regulated voltage. In such a system, the regulated voltage impressed upon the battery is normally greater than the electromotive force (emf) of the battery resulting in current flow into the battery for charging the battery. However, when the electrical loads exceed the alternator output capability, the voltage regulator cannot maintain the regulated voltage and the system voltage decreases. If the system voltage decreases below the battery emf, current flows from the battery to the electrical loads, thereby causing the battery to discharge.

It is desirable that the driver of the vehicle be made aware that the battery is discharging, especially if the discharging condition persists over an extended period of time. To this end, it is known to provide an ammeter for measuring current flowing into and out of the battery. This method of indicating a discharging battery, however, requires a current shunt and a voltmeter, which add to the expense and complexity of the vehicle electrical system. A method of detecting a discharging battery condition for the purpose of altering engine speed to prevent battery discharge is disclosed in U.S. Pat. No. 4,424,477 issued to Enoshima. Enoshima discloses the use of a standard voltage, i.e., 12 volts for a vehicle electrical system, as a fixed reference for continuous comparison with the system voltage. However, the use of a fixed voltage reference in determining when the battery is discharging does not recognize and account for variations in battery emf due to the specific gravity of the battery acid, the state-of-charge of the battery, manufacturing tolerances, and battery temperature. The invention disclosed herein is addressed to overcoming these problems.

In accord with this invention, the voltage of the battery is monitored during engine operation and compared to a reference voltage value representing the emf of the battery to determine whether the battery is discharging. Specifically, the voltage of the battery is measured before cranking the engine each time the engine is started and stored in memory as the reference voltage value. During engine operation, the battery voltage is monitored and compared to the stored reference value at predetermined timed intervals. An indication that the battery is discharging is provided only after a discharging condition, i.e., the battery voltage is less than the reference voltage value, is detected at each of a predetermined number of consecutive timed intervals.

Figure 2:
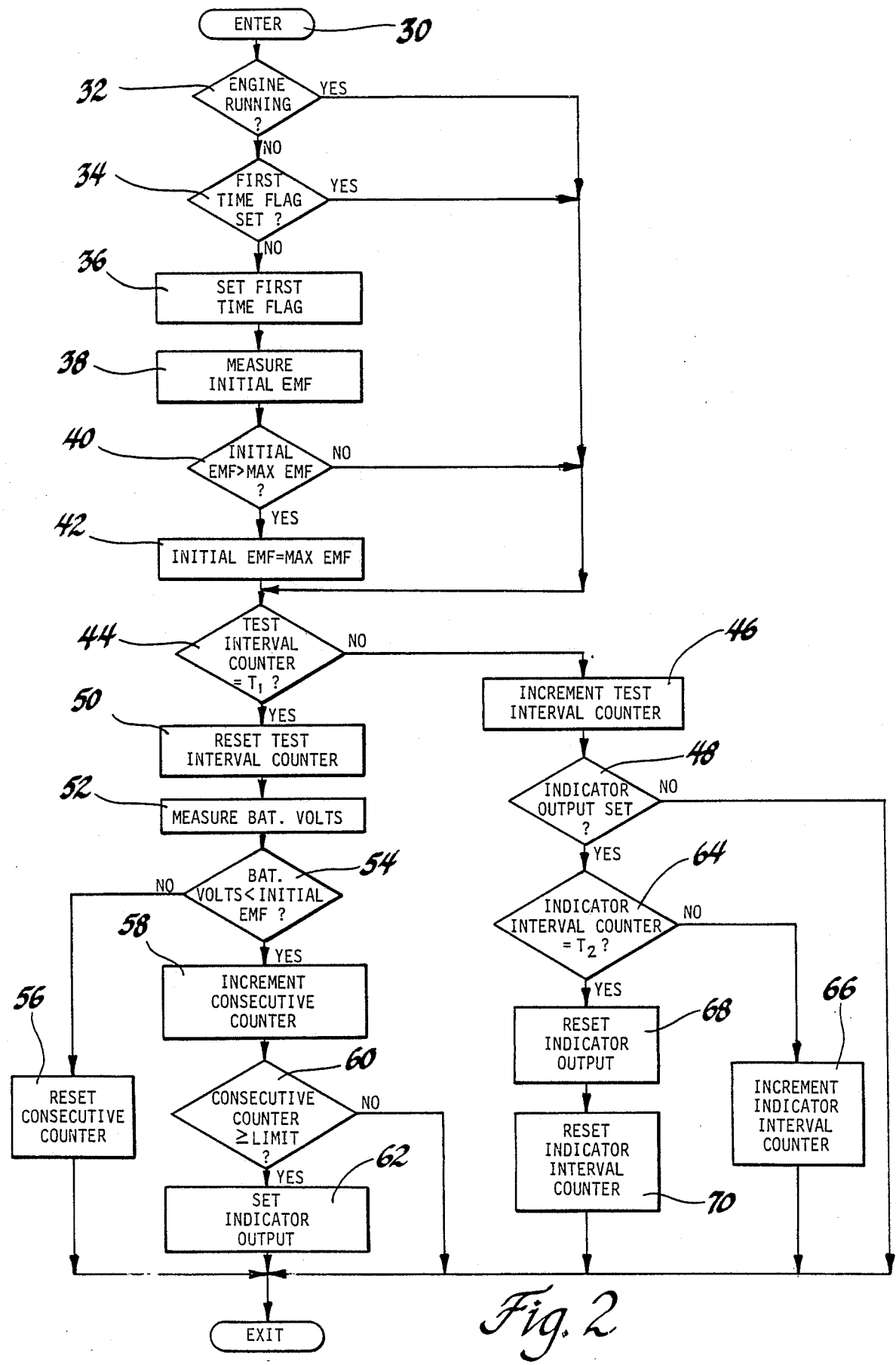

The invention is further described below, as to a specific embodiment, in conjunction with the following drawings:

FIG. 1 is a diagrammatic representation of a vehicle electrical system that incorporates the principles of the present invention; and FIG. 2 is a diagram illustrative of the operation of the system of FIG. 1.

Referring to FIG. 1, there is depicted a vehicle electrical system 10 of the type to which the present invention is applicable. The system 10 includes an alternator 12, a voltage regulator 14, a storage battery 16, and various vehicle electrical loads 18 selectively energized through switches 20. Although the electrical loads 18 are shown by a single box for simplicity, it is understood that the box represents a plurality of power consuming vehicle accessories, such as headlamps, a blower fan, a windshield wiper motor, and an electric window defogger. Likewise, the single box shown for the switches 20 represents a plurality of control switches for the various electrical loads 18. For purposes of illustration, but without any limitation of the invention, the alternator 12 includes a rectifier (not shown) and, when driven by an engine 22, provides unidirectional current as a function of the speed of the engine 22 and the current provided to a alternator field 24 by the voltage regulator 14. The alternator 12 supplies a maximum current when the field 24 is turned full on by the voltage regulator 14.

During normal operation of the system 10, the alternator 12 supplies direct current to the parallel combination of the battery 16 and the electrical loads 18. The voltage regulator 14 senses the system voltage defined herein as the voltage produced by the alternator 12 and impressed upon both the battery 16 and the electrical loads 18, neglecting any voltage drops in the wiring of the system 10. The voltage regulator 14, by controlling the current in the field 24, maintains the system voltage at a predetermined voltage that may be, for example, temperature compensated so as to increase with decreasing battery temperatures.

The storage battery 16 is a typical lead-acid battery having an available electromotive force (emf), i.e., open-circuit voltage, that differs from the working voltage of the battery under load by the voltage drop within the battery cells caused by the flow of current. The emf of a particular battery varies as a function of battery conditions including the acid concentration, state-of-charge, and temperature of the battery. Moreover, the emf of a battery determines whether a battery charges or discharges when a voltage is impressed upon the battery. For example, in the system 10 of FIG. 1, the battery is charging when the system voltage is greater than the emf of the battery 16 and discharging when the system voltage is less than the emf of the battery 16. When the system voltage and the battery emf are equal, no current flows into or out of the battery. During the usual operation of the system 10, the voltage regulator maintains the system voltage at a level above the emf of the battery 16, resulting in charging of the battery 16. The battery 16 normally delivers current only under transient conditions when the voltage regulator 14 is responding to the sudden addition of an electrical load to the system 10.

As the electrical loads 18 are increased so as to require current at the regulated voltage above the maximum current output of the alternator 12, the system voltage decreases. The battery 16 begins discharging when the system voltage decreases below the emf of the battery 16. Prolonged discharging of a battery can result in decreased capacity of the battery to start the vehicle engine. Therefore, it is desirable to provide an indication to the driver of a vehicle that the system 10 is experiencing a prolonged battery discharging condition. The driver may then respond by either turning off any of the various vehicle electrical loads 18, or by increasing engine speed, i.e., increasing the maximum output of the alternator 12. The indication would also warn the driver of a failure of any other component in the system 10, such as the alternator 12.

In the method of and apparatus for indicating a discharging vehicle battery according to the present invention, the emf of the battery 16 is measured before power is supplied to the cranking motor each time the engine is started. This measured battery emf is stored and compared with the system voltage during engine operation to determine whether a battery discharging condition exists. Use of the initial measured emf of the battery 16 as a dynamic reference value automatically compensates for any variations in the emf of the battery 16 due to construction, acid concentration, state-of-charge, and temperature. Consequently, an accurate indication of when the battery is discharging is achieved. Furthermore, the vehicle battery discharging indicator of the illustrated embodiment tests for the presence of a discharging condition at consecutive timed intervals before providing an indication to the driver.

For purposes of illustration, but without any limitation of the invention, measurement of the initial emf of the battery 16 is initiated by a typical vehicle ignition/start switch 25. The operation of a typical vehicle ignition/start switch proceeds from an off position, through an ignition position, to a spring-biased start position. With such an ignition/start switch, the initial emf of the battery 16 is measured when the switch is turned to the ignition position before proceeding to the start position where the starting motor is energized and, consequently, the battery 16 is discharged.

In order to perform the test of the present invention, an electronic control unit (ECU) 26 receives an analog input signal from the battery 16. This analog input signal represents the emf of the battery 16 when the engine is not running and represents the system voltage of the system 10 when the engine is running. The ECU 26 also provides an output signal to an indicator 28 which, for example, may be an incandescent, dash-mounted indicator lamp. The indicator 28 warns the driver of the vehicle of the discharging condition. It is anticipated that the output to the indicator 28 could also be used to control the turning off of electrical loads without departing from the spirit of the present invention.

In the illustrated embodiment of the invention, ECU 26 takes the form of a digital computer. The digital computer is standard in form and includes a microprocessing unit (MPU) which executes an operating program permanently stored in a read only memory (ROM). Contained within the MPU are conventional counters, registers, accumulators, and flag flip flops. The MPU receives inputs from a two-phase clock and generates the required timing signals for the remainder of the computer system. The MPU further receives an input from a restart circuit which generates a signal for initiating the remaining components of the computer system upon startup of the vehicle such as by operation of the standard vehicle ignition/start switch to the ignition position.

The digital computer also includes a random access memory (RAM) into which data may be temporarily stored and from which data may be read at various address locations as determined in accord with the programs stored in the ROM. A power control unit (PCU) receives voltage from the vehicle battery through the vehicle ignition/start switch and provides regulated power to the various operating circuits in the ECU 28.

The digital computer further includes an analog to digital converter (ADC). The ADC receives a plurality of vehicle and engine parameter inputs including that from the battery 16. The signals applied to the ADC are each sampled and converted under control of the MPU and stored in ROM designated RAM memory locations.

When power is first applied to the ECU 28, such as by operation of the standard vehicle ignition/switch from the off position to the ignition position, a restart signal from a restart circuit provides initialization of the digital computer of ECU 28. During this initialization, initial values stored in the ROM are entered into ROM designated locations in the RAM, and counters, flags and times are initialized. Thereafter, the program proceeds to execute the operating program stored in the ROM to control performance of the battery discharging indicator test.

A closed-loop battery discharging indicator routine that is repeated at timed intervals is generally illustrated in FIG. 2. In general, this routine measures the emf of the battery once on the first pass before the engine is started and stores the lesser of the measured emf and a maximum emf as a reference initial emf value. On subsequent passes through the routine, the system voltage is measured at predetermined timed test intervals and compared to the stored reference value. If the system voltage is less than the reference value at each of a predetermined number of consecutive timed test intervals, the indicator output is set for a predetermined timed indicator interval less than the test interval so that the indicator turns off before the next test is performed. Once the predetermined number of consecutive discharge conditions is reached, the indicator will be set for each subsequent discharging condition until the consecutive counter is cleared by a nondischarging test result.

Referring to FIG. 2, the battery discharging indicator routine is entered at point 30 and proceeds to a step 32 where it determines whether the engine 22 is running. If the engine is not running, the program proceeds to a step 34 and determines whether a first time flag is set. If the first time flag is not set, the program proceeds to a step 36 and sets the first time flag.

Next, the program proceeds to a step 38 where the initial emf, i.e., the present value of the battery voltage, is accessed from RAM. At a step 40, the battery voltage accessed in the step 38 is compared to a maximum emf value. In one embodiment of the present invention, the maximum emf value represents the maximum expected emf for the subject battery containing acid at 1.280 specific gravity, and being at 100 percent state-of-charge and 80 degrees Fahrenheit. It is assumed that a measured battery emf greater than the maximum expected emf indicates a battery having plate surface charge in addition to the available emf of the battery. In a vehicle application, a surface charge condition may exist for a short time period after the vehicle is shut off if the battery has just been charging. Therefore, if the battery voltage is greater than the maximum emf value in the step 40 the program proceeds to a step 42 where the initial emf is set equal to the maximum emf value.

The program proceeds to a step 44 directly from the step 42. The program also proceeds to the step 44 from the step 32 if it is determined that the engine is running, from the step 34 if the first time flag is set, and from the step 40 if the initial emf is not greater than the maximum emf value. At the step 44, the program determines whether a test interval counter is equal to a value $T_1$ representing a timed interval before the first test and between subsequent tests for a discharging battery. During the initial passes through the routine, the test counter will not equal $T_1$, and the program will proceed to a step 46 where the test counter will be incremented. Next, a step 48 determines whether an indicator output is set. As will be described further, the indicator output is set when the routine detects consecutive occurrences of a discharging battery condition. If the indicator output is not set, the program exits from the step 48.

Upon repeated executions of the routine of FIG. 2, the program increments the test interval counter at the step 46 until the time is determined to be equal to $T_1$ at the step 44. Thereafter, the program proceeds to a step 50 where the test interval counter is reset. From the step 50, the program proceeds to a step 52 where the system voltage, i.e., the present value of the battery voltage, is accessed from RAM.

From the step 52 the program proceeds to a step 54 where it determines whether the system voltage measured at the step 52 is less than the stored initial emf of the battery as determined in the steps 38, 40, and 42. Under normal conditions when the battery is charging, the system voltage will not be less than the initial emf of the battery and, therefore, the program will proceed to a step 56. At the step 56, a consecutive counter representing the number of consecutive battery discharging conditions is reset before the program proceeds to exit.

If at the step 54, the measured system voltage is less than the stored initial battery emf, the program proceeds to a step 58 where the consecutive counter is incremented. From the step 58 the program proceeds directly to a step 60 where the stored count in the consecutive counter, representing the number of consecutive battery discharging determinations, is compared to a predetermined limit. The predetermined limit represents the number of consecutive discharging conditions at which an indicator output will be invoked. For purposes of illustration, but without any limitation upon the invention, the limit is set at three consecutive occurrences of a discharging condition detected at test intervals of five minutes, i.e., $T_1$, equals five minutes. Until the limit is reached, the program exits directly from the step 62. When the consecutive counter equals or exceeds the limit, the program proceeds to a step 62 where an indicator output is set before the program exits. In this way, the indicator output is set at the third occurrence of a discharging condition and at each subsequent discharging condition until a nondischarging condition is detected at the step 54 and the consecutive counter is reset at the step 56.

Returning to the step 48, if the output indicator has been set, the program proceeds from the step 48 to a step 64 where it determines whether an indicator interval counter is equal to a value $T_2$ representing a timed interval during which the indicator output is set.

For repeated executions of the routine immediately after the indicator output has been set, the indicator interval counter will not yet equal $T_2$ and, therefore, the program will proceed from the step 64 to a step 66. At the step 66, the program increments the indicator interval counter before it proceeds to exit.

Upon further repeated executions of the routine of FIG. 2 after the indicator output has been set, the program increments the indicator interval timer at the step 66 until the counter value is equal to $T_2$, at which time the program proceeds from the step 64 to a step 68 where the indicator output is reset. The program proceeds directly from the step 68 to a step 70 where the indicator interval counter is reset, after which the program proceeds to exit.

For purposes of illustration, but without any limitation upon the invention, the value of $T_2$ is set at a value less than $T_1$, i.e., one minute, so that the indicator output will remain on for only a portion of the timed interval between tests for a discharging condition. In this way, continued occurrences of a discharging condition will result in periodic display of an indication for a short period of time.

The preferred embodiment set forth in the foregoing steps provides for testing for a battery discharging condition at five minute intervals and providing a one minute indication after the occurrence of three consecutive discharging conditions and at each consecutive occurrence thereafter for illustration purposes only. Other time intervals and consecutive occurrence limits may be used. However it is preferable to test at timed intervals rather than continuously in order to avoid warning the driver of temporary or transient discharging conditions.

In the foregoing description, it will be appreciated that a small load is placed upon the battery 16 by the ECU 26 during measurement of the intial battery emf before starting of the vehicle. To the extent that the small current draw of the ECU 26 does not result in a working voltage of the battery significantly different from the emf of the battery, i.e., open-circuit voltage, the illustrated embodiment accurately practices the principles of the present invention.

It will be appreciated that the foregoing description of a preferred embodiment of the invention is presented by way of illustration only (and not by way of any limitation) and that various alternatives and modifications may be made to the illustrated embodiment without departing from the spirit and scope of the invention.

The embodiments of the invention in which an exclusive property or privilege is claimed are defined as follows:

1. In a motor vehicle powered by an internal combustion engine including a storage battery having an open-circuit emf dependent upon battery conditions, an electrical load, and a unidirectional current source supplying current to the parallel combination of the battery and the load, the current source normally providing sufficient current to the battery and the load to impress upon the battery a voltage greater than the open-circuit emf of the battery thereby causing the battery to charge, wherein the battery discharges when the voltage impressed upon the battery is below the open-circuit emf of the battery, a method of indicating when the battery is discharging, comprising the steps of:
   a. measuring a first voltage of the battery before cranking the engine each time the engine is started;
   b. storing the first voltage as a reference voltage value, the reference voltage value representing the open-circuit emf of the battery compensated for the battery conditions existing when the first voltage is measured;
   c. measuring a second voltage of the battery after the engine is started, the second voltage having a value less than the open-circuit emf of the battery when the battery is discharging;
   d. comparing the second voltage with the stored reference voltage value; and e. indicating that the battery is discharging when the second voltage is less than the reference voltage value.

2. The method of indicating when the battery is discharging of claim 1 in which step b is performed by storing as a reference voltage value the lesser of the first voltage and a predetermined voltage value representing the maximum open-circuit emf of the battery without a surface charge.

3. The method of indicating when the battery is discharging of claim 1 in which steps c and d are performed at predetermined first timed intervals and step e is performed after the occurrence of a predetermined number of consecutive first timed intervals for which the second voltage is less than the reference voltage value.

4. The method of indicating when the battery is discharging of claim 3 in which step e is performed during a predetermined second timed interval less than the first timed intervals, whereby step e may be initiated after each comparing step and terminated prior to the next comparing step.

5. A discharging indicator for a storage battery of a motor vehicle powered by an internal combustion engine, the vehicle including an electrical load coupled in parallel to the battery during engine operation and the battery having an open-circuit emf, the indicator comprising:

indicator means effective when energized for indicating battery discharging;

a unidirectional current source for supplying current to the battery and the load at a system voltage normally greater than the open-circuit emf of the battery for charging the battery, the battery discharging when the system voltage is less than the open-circuit emf of the battery; and means for (A) measuring a first voltage of the battery before cranking the engine each time the engine is started, (B) storing the first voltage as a reference voltage value, (C) measuring a second voltage of the battery after the engine is started, (D) comparing the second voltage with the stored reference voltage value and (E) energizing the indicator means when the second voltage is less than the reference voltage value to provide a indication of battery discharging.

6. A discharging indicator for a storage battery of a motor vehicle powered by an internal combustion engine, the vehicle including an electrical load coupled in parallel to the battery during engine operation and an ignition switch operable to a run position and then to a crank position at which current is supplied from the battery to a cranking motor for starting the engine, the battery having an open-circuit emf, the indicator comprising:

indicator means effective when energized for indicating battery discharging;

means for supplying current to the battery and the load at a system voltage normally greater than the open-circuit emf of the battery for charging the battery, the battery discharging when the system voltage is less than the open-circuit emf of the battery; and means for (A) measuring a first voltage of the battery after the ignition switch is operated to the run position and before being operated to the crank position so that the first voltage is measured before current is supplied from the battery to the cranking motor, (B) storing the first voltage as a reference voltage value, the reference voltage value representing the open-circuit emf of the battery compensated for the battery conditions existing when the first voltage is measured, (C) measuring a second voltage of the battery at predetermined first time intervals after the engine is started, (D) comparing the second voltage with the stored reference voltage value at each of the predetermined first timed intervals and (E) energizing the indicator means for a second timed interval less than the first timed interval to indicate that the battery is discharging after the occurrence of a predetermined number of consecutive first timed intervals for which the second voltage is less than the reference voltage value.

* * * * *